(12) United States Patent
Konishi

(10) Patent No.: US 11,976,811 B2
(45) Date of Patent: May 7, 2024

(54) LIGHT EMITTING DEVICE

(71) Applicant: DENKA COMPANY LIMITED, Tokyo (JP)

(72) Inventor: Masahiro Konishi, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 17/617,888

(22) PCT Filed: Jun. 5, 2020

(86) PCT No.: PCT/JP2020/022280
§ 371 (c)(1),
(2) Date: Dec. 9, 2021

(87) PCT Pub. No.: WO2020/250821
PCT Pub. Date: Dec. 17, 2020

(65) Prior Publication Data
US 2022/0307680 A1    Sep. 29, 2022

(30) Foreign Application Priority Data

Jun. 10, 2019 (JP) ................................ 2019-108125

(51) Int. Cl.
*F21V 29/51*    (2015.01)
*F21V 9/40*    (2018.01)
(Continued)

(52) U.S. Cl.
CPC ................ *F21V 29/51* (2015.01); *F21V 9/40* (2018.02); *F21V 19/0015* (2013.01); *F21V 29/763* (2015.01)

(58) Field of Classification Search
CPC ........ F21V 29/51; F21V 29/71; F21V 29/713; F21V 29/717; F21V 29/67; F21V 29/673; F21V 29/677; F21S 45/47; F21S 45/48
See application file for complete search history.

(56) References Cited

U.S. PATENT DOCUMENTS 9,719,673 B2    8/2017 Geisler
2010/0103678 A1*  4/2010 Van De Ven ............. F21K 9/68
                                                        362/373
(Continued)

FOREIGN PATENT DOCUMENTS

CN    106163113 A    11/2016
JP    H10-301498 A   11/1998
(Continued)

OTHER PUBLICATIONS

Aug. 18, 2020 International Search Report issued in International Patent Application No. PCT/JP2020/022280.
(Continued)

*Primary Examiner* — Sean P Gramling
(74) *Attorney, Agent, or Firm* — Oliff PLC

(57) ABSTRACT

A light emitting device of the present invention includes a light emitting substrate including an insulating substrate, a circuit pattern layer disposed on one surface of the insulating substrate, and at least one light emitting element bonded to the circuit pattern layer, a flat heat pipe mechanism that removes heat from the light emitting substrate, a temperature of which is increased with light emission of the at least one light emitting element, and a cooling unit that cools the flat heat pipe mechanism.

7 Claims, 16 Drawing Sheets

(51) Int. Cl.
*F21V 19/00* (2006.01)
*F21V 29/76* (2015.01)

(56) References Cited

U.S. PATENT DOCUMENTS

| | | | | |
|---|---|---|---|---|
| 2010/0141108 A1* | 6/2010 | Liu | ............... | F21V 29/83 |
| | | | | 313/12 |
| 2012/0300430 A1* | 11/2012 | Kawashima | ............ | F21K 9/232 |
| | | | | 362/84 |
| 2015/0131270 A1 | 5/2015 | Geisler | | |

FOREIGN PATENT DOCUMENTS

| | | | |
|---|---|---|---|
| JP | 2000-031546 | A | 1/2000 |
| JP | 2005-352427 | A | 12/2005 |
| JP | 2015-144041 | A | 8/2015 |
| JP | 2017-059493 | A | 3/2017 |
| TW | 201350755 | A | 12/2013 |

OTHER PUBLICATIONS

Dec. 4, 2023 Office Action issued in Taiwanese Patent Application No. 109119305.
Mar. 5, 2024 Office Action issued in Japanese Application No. 2021-526064.

* cited by examiner

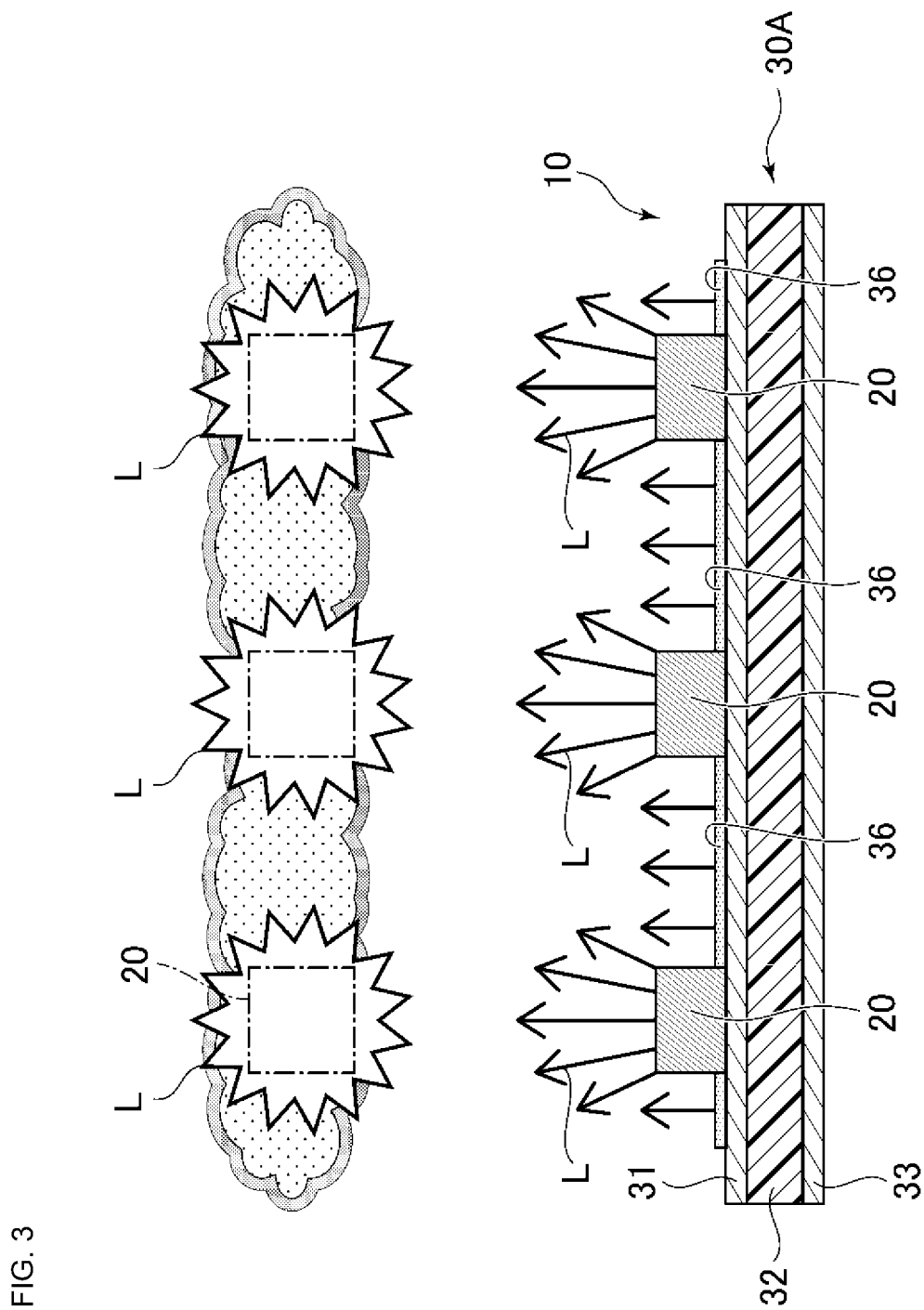

LIGHT EMITTING DEVICE

TECHNICAL FIELD

The present invention relates to a light emitting device.

BACKGROUND ART

Patent Document 1 discloses an LED lighting equipment including a substrate on which a light emitting element (LED element) is mounted.

Related Document

Patent Document

[Patent Document 1] Chinese Patent Publication No. 106163113

SUMMARY OF THE INVENTION

Technical Problem

For example, in a case of an LED lighting equipment of Patent Document 1, if power is supplied to a light emitting element and the light emitting element continuously emits light, the light emitting element may fail due to heat generated due to the light emission thereof.

An object of the present invention is to provide a light emitting device including an insulating substrate and a light emitting substrate including a plurality of light emitting elements, in which heat of the light emitting substrate, a temperature of which is increased with the light emission, can be appropriately removed.

Solution to Problem

A light emitting device according to a first aspect of the present invention includes a light emitting substrate including an insulating substrate, a circuit pattern layer disposed on one surface of the insulating substrate, and at least one light emitting element bonded to the circuit pattern layer, a flat heat pipe mechanism that removes heat from the light emitting substrate, a temperature of which is increased with light emission of the at least one light emitting element, and a cooling unit that cools the flat heat pipe mechanism.

A light emitting device according to a second aspect of the present invention includes a light emitting substrate including an insulating substrate, a circuit pattern layer disposed on one surface of the insulating substrate, at least one light emitting element bonded to the circuit pattern layer, and a phosphor layer that is disposed on one surface side of the insulating substrate and includes a phosphor in which a light emission peak wavelength, in a case where light emitted by the at least one light emitting element is used as excitation light, is in a visible light region, a flat heat pipe mechanism that removes heat from the light emitting substrate, a temperature of which is increased with light emission of the at least one light emitting element, and a cooling unit that cools the flat heat pipe mechanism.

In the light emitting device according to a third aspect of the present invention, the light emitting device further includes a heat sink that dissipates heat of the flat heat pipe mechanism.

In the light emitting device according to a fourth aspect of the present invention, the cooling unit cools the heat sink by applying an air flow to the heat sink.

In the light emitting device according to a fifth aspect of the present invention, the heat sink is disposed on a side opposite to the light emitting substrate with the flat heat pipe mechanism interposed between the heat sink and the light emitting substrate, and dissipates heat removed from the light emitting substrate by the flat heat pipe mechanism.

In the light emitting device according to a sixth aspect of the present invention, the at least one light emitting element is a plurality of light emitting elements.

In the light emitting device according to a seventh aspect of the present invention, the phosphor layer covers a portion that is equal to or more than 80% of the one surface of the insulating substrate.

In the light emitting device according to an eighth aspect of the present invention, the light emitting device further includes
an accommodation unit that accommodates the light emitting substrate and the flat heat pipe mechanism.

In the light emitting device according to a ninth aspect of the present invention, the accommodation unit further accommodates the cooling unit.

In the light emitting device according to a tenth aspect of the present invention, the flat heat pipe mechanism is an L-shaped flat heat pipe having a first flat plate portion which is a heat input portion and a second flat plate portion which is a heat output portion, the flat heat pipe is disposed in a state where the first flat plate portion faces the other surface side of the insulating substrate, and the cooling unit cools the flat heat pipe by applying an air flow to the second flat plate portion.

In the light emitting device according to an eleventh aspect of the present invention, the heat sink is disposed between the second flat plate portion and the cooling unit.

In the light emitting device according to a twelfth aspect of the present invention, the flat heat pipe mechanism includes a first flat heat pipe and a second flat heat pipe, each of the first flat heat pipe and the second flat heat pipe is an L-shaped flat heat pipe having a first flat plate portion which is a heat input portion and a second flat plate portion which is a heat output portion, the first flat heat pipe is disposed in a state where the first flat plate portion thereof faces the other surface side of the insulating substrate, and the second flat heat pipe is disposed so that the first flat plate portion thereof overlaps the first flat plate portion of the first flat heat pipe.

In the light emitting device according to a thirteenth aspect of the present invention, the first flat heat pipe and the second flat heat pipe are disposed in a state where the second flat plate portions extend to opposite sides of each other.

In the light emitting device according to a fourteenth aspect of the present invention, the flat heat pipe mechanism includes a first flat heat pipe and a second flat heat pipe that are flat and overlap each other, and is disposed to overlap the insulating substrate on the other surface side of the insulating substrate.

In the light emitting device according to a fifteenth aspect of the present invention, the cooling unit is disposed on a side opposite to the light emitting substrate with the flat heat pipe mechanism interposed between the cooling unit and the light emitting substrate.

In the light emitting device according to a sixteenth aspect of the present invention, the first flat heat pipe and the second flat heat pipe are each configured of a plurality of pipes arranged side by side, and an arrangement direction of the plurality of pipes configuring the first flat heat pipe and an arrangement direction of the plurality of pipes configuring the second flat heat pipe are directions that intersect with each other.

BRIEF DESCRIPTION OF THE DRAWINGS

FIG. 3 is a diagram for explaining a light emitting operation of the light emitting substrate of the first embodiment.

DESCRIPTION OF EMBODIMENTS

Overview

Figure 1A:
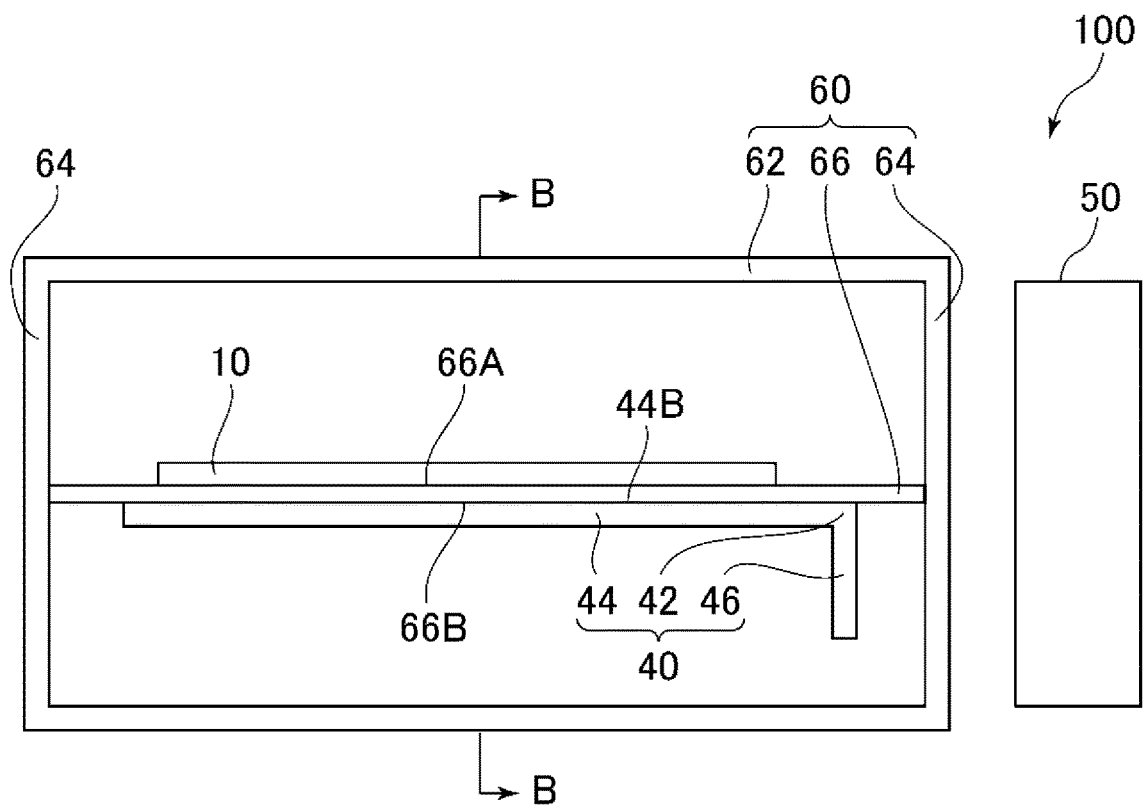
FIG. 1A is a schematic view of a light emitting device of a first embodiment.

Hereinafter, first to sixth embodiments, which are examples of the present invention, will be described in this order. In addition, in all the drawings referred to in the following description, the same reference numerals are used for the same constituent elements and the description thereof will not be repeated.

First Embodiment

Hereinafter, the first embodiment will be described with reference to FIGS. 1A to 4. First, a function and a configuration of a light emitting device 100 of the present embodiment will be described with reference to FIGS. 1A and 1B. Next, a light emitting operation of the light emitting device 100 of the present embodiment will be described with reference to FIG. 3. After that, effects of the present embodiment will be described.

<Function and Configuration of Light Emitting Device of First Embodiment>

The light emitting device 100 of the present embodiment has a function of emitting light by causing a light emitting substrate 10 to emit light. For example, the light emitting device 100 is used as a lighting device.

The light emitting device 100 includes a light emitting substrate 10, a flat heat pipe 40 (an example of a flat heat pipe mechanism), a cooling fan 50 (an example of a cooling unit), a housing 60 (an example of an accommodation unit), a power source (not shown), and a switch (not shown).

Here, the light emitting substrate 10, the flat heat pipe 40, and the power source are accommodated in the housing 60. The light emitting substrate 10 and the flat heat pipe 40 are disposed to overlap each other in a plate thickness direction of the light emitting substrate 10. The cooling fan 50 is disposed to be adjacent to the housing 60. The switch is attached to an outer surface of the housing 60.

[Light Emitting Substrate]

Next, a method for manufacturing the light emitting substrate 10 of the present embodiment will be described with reference to FIGS. 2A and 2B.

The light emitting substrate 10 is rectangular as an example when seen from a front surface 31 side and a rear surface 33 side, that is, when seen in the plate thickness direction. In addition, the light emitting substrate 10 includes a plurality of light emitting elements 20, a phosphor substrate 30, and electronic components (not shown) such as a connector, a driver IC, and the like, and the plurality of light emitting elements 20 and the electronic components are mounted on the phosphor substrate 30. The light emitting substrate 10 is configured to cause the plurality light emitting elements 20 to emit light, when power is supplied from a power source (not shown) through the connector (see FIG. 3).

Figure 1B:
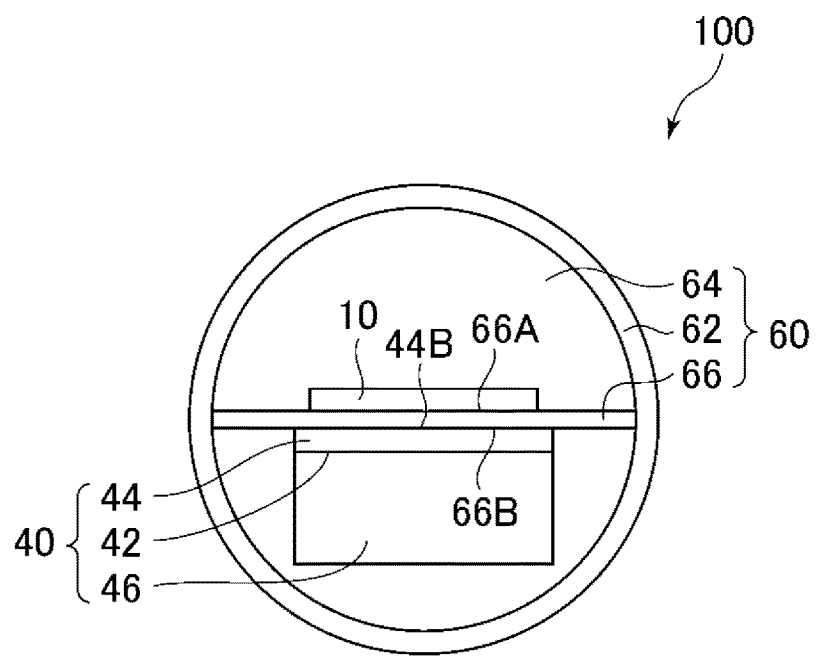
FIG. 1B is a cross-sectional view taken along a cutting line B-B of FIG. 1A.

As shown in FIGS. 1A and 1B, the light emitting substrate 10 is fixed to a plate 66 by bringing the rear surface 33 into contact with a front surface 66A of the plate 66 configuring a part of the housing 60.

<Plurality of Light Emitting Elements>

As an example, each of the plurality of light emitting elements 20 is a Chip Scale Package (CSP) in which a flip chip LED (not shown) is incorporated. As shown in FIG. 1A, the plurality of light emitting elements 20 are mounted on the phosphor substrate 30 in a state of being regularly arranged over the entire front surface 31 of the phosphor substrate 30. A correlated color temperature of the light emitted by each light emitting element 20 is 3,018 K as an example. In the present embodiment, the flat heat pipe 40 and the cooling fan 50 dissipate heat (cool) so that a temperature of the phosphor substrate 30 is room temperature to 100° C. or lower, during the light emitting operation of the plurality of light emitting elements 20.

Here, to supplement the meaning of "to" used in the numerical range in the present specification, for example, "50° C. to 100° C." means "equal to or higher than 50° C. and equal to or lower than 100° C.". That is, "to" used in the numerical range in this specification means "equal to or more than the description part before "to" and equal to or less than the description part after "to".

<Phosphor Substrate>

Figure 2A:
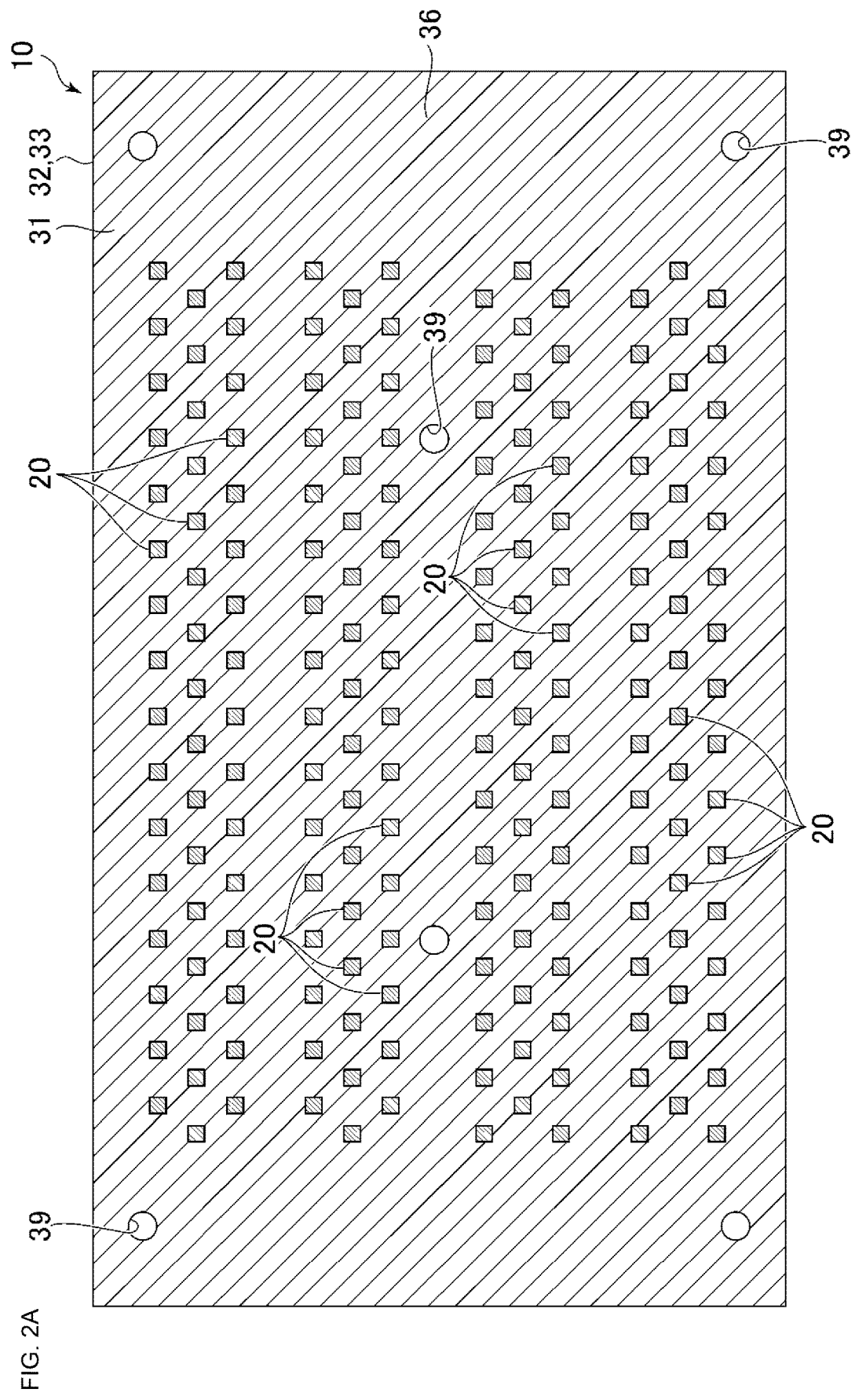
FIG. 2A is a plan view of a light emitting substrate included in the light emitting device of the first embodiment.
Figure 2B:
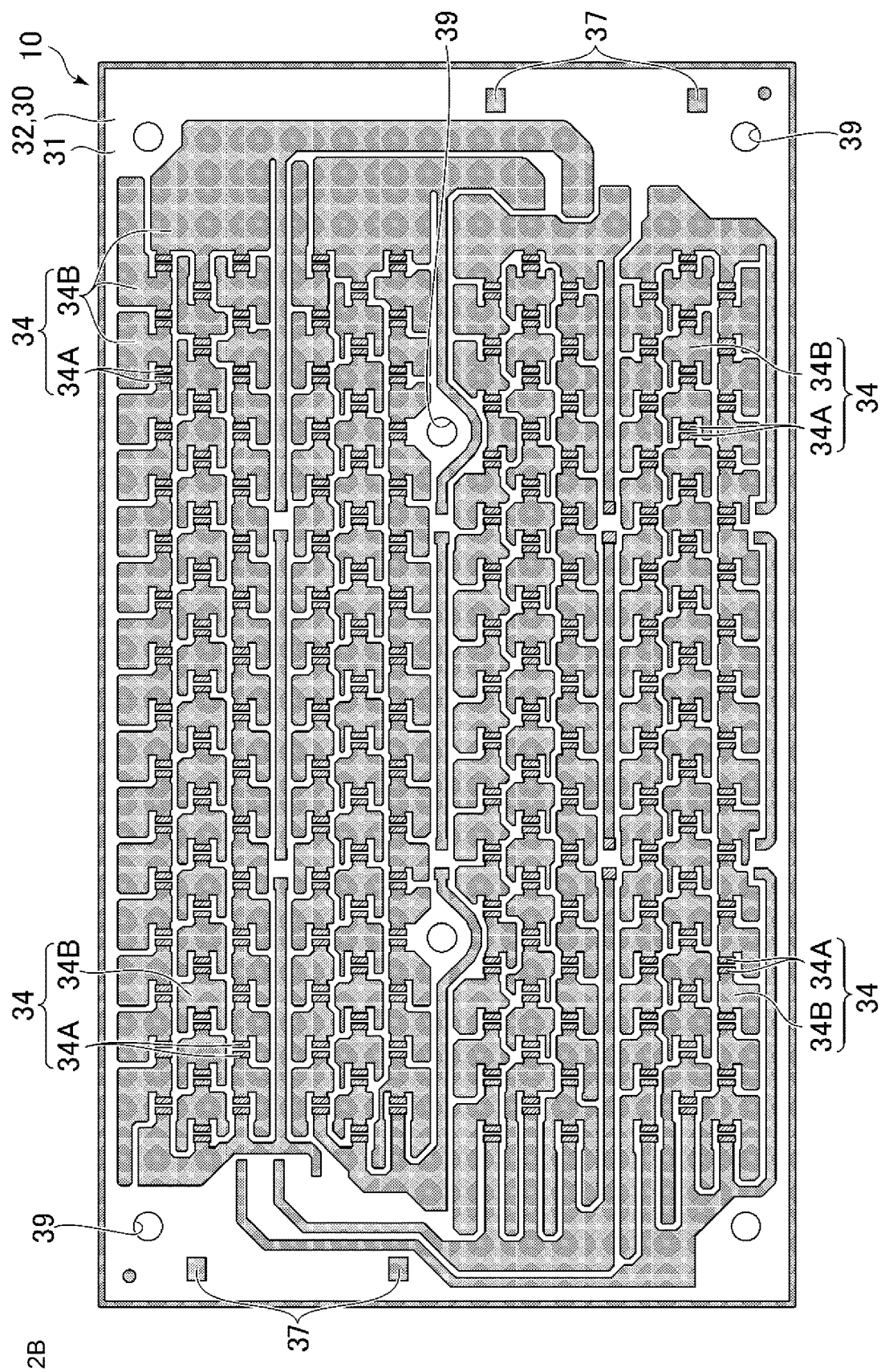
FIG. 2B is a plan view of an insulating substrate (a light emitting substrate excluding all light emitting elements and a phosphor layer) included in the light emitting substrate of the first embodiment.
Figure 4:
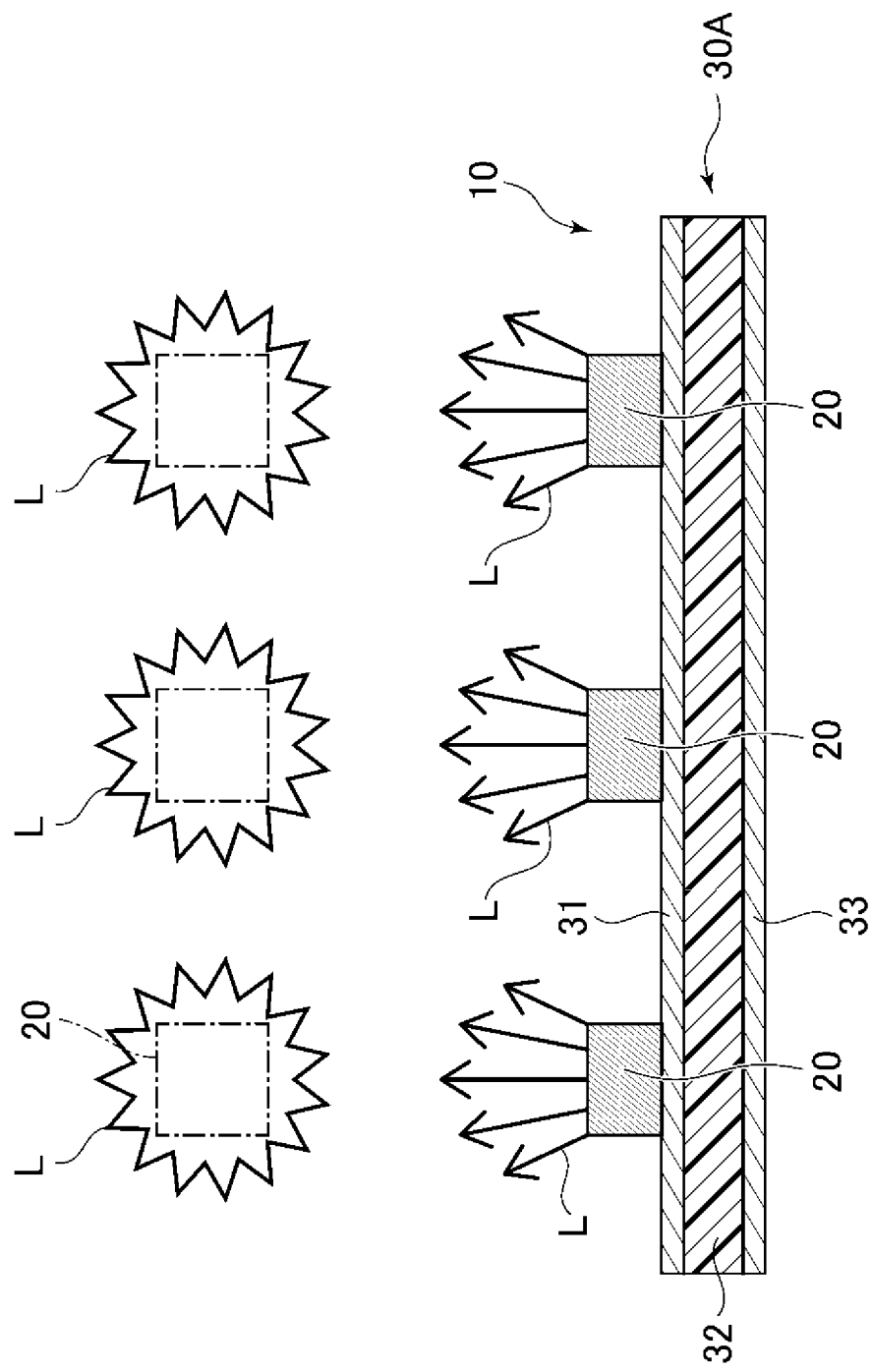
FIG. 4 is a diagram for explaining a light emitting operation of a light emitting substrate which does not include a phosphor layer.

The phosphor substrate 30 includes an insulating substrate 32, a circuit pattern layer 34, a phosphor layer 36, and a rear surface pattern layer (not shown) (see FIGS. 2A and 2B). Here, although the phosphor layer 36 is not shown in FIG. 2B, the phosphor layer 36 is, for example, disposed on a portion of the front surface 31 of the insulating substrate 32 and the circuit pattern layer 34, other than a plurality of electrode pairs 34A which will be described later, as shown in FIG. 2A.

In addition, the phosphor substrate 30 is formed with six through holes 39 at four portions near the four corners and two portions near the center (see FIGS. 2A and 2B). The six through holes 39 are used as positioning holes during the manufacturing of the phosphor substrate 30 and the light emitting substrate 10. In addition, the six through holes 39 are used as mounting screw holes for ensuring a heat-drawing effect (preventing warping and floating of the substrate) of a (light emitting) lamp housing. As will be described later, the phosphor substrate 30 of the present embodiment is manufactured by processing (etching or the like) a motherboard in which copper foil layers are provided on both sides of an insulating plate, and CS-3305A manufactured by Risho Kogyo Co., Ltd. is used as an example of the motherboard.

<Insulating Substrate>

As an example, the insulating substrate 32 has the following features.

As described above, a shape thereof is, for example, rectangular when seen from the front surface 31 side and the rear surface 33 side.

A material thereof is, for example, an insulating material containing a bismaleimide resin and a glass cloth.

A thickness thereof is, for example, 100 µm.

Coefficients of thermal expansion (CTE) thereof in a vertical direction and a horizontal direction are, for example, equal to or less than 10 ppm/° C. in a range of 50° C. to 100° C., respectively. From another point of view, each of the coefficients of thermal expansion (CTE) in the vertical direction and the horizontal direction is, for example, 6 ppm/K. This value is substantially the same as that of the light emitting element 20 of the present embodiment (90% to 110%, that is, within ±100).

A glass transition temperature thereof is, for example, higher than 300° C.

A storage elastic modulus is, for example, greater than $1.0 \times 10^{10}$ Pa and smaller than $1.0 \times 10^{11}$ Pa in a range of 100° C. to 300° C.

A bending elastic modulus in the vertical direction and the horizontal direction is, for example, 35 GPa and 34 GPa in a normal state, respectively.

A hot bending elastic modulus in the vertical direction and the horizontal directions is, for example, 19 GPa at 250° C.

A water absorption rate is, for example, 0.13%, in a case where the insulating layer is left for 24 hours in a temperature environment of 23° C.

A relative permittivity is, for example, 4.6 under a normal state of 1 MHz.

A dielectric loss tangent is, for example, 0.010 under a normal state of 1 MHz.

[Circuit Pattern Layer]

The circuit pattern layer 34 is a metal layer (copper foil layer as an example) provided on the surface 31 side of the insulating substrate 32, and is electrically connected to a terminal 37 bonded to a connector (not shown). The circuit pattern layer 34 has a function of supplying power supplied from the power source (not shown) through the connector to the plurality of light emitting elements 20. Accordingly, a part of the circuit pattern layer 34 is the plurality of electrode pairs 34A to which the plurality of light emitting elements 20 are bonded. That is, the circuit pattern layer 34 is connected to each light emitting element 20.

In addition, as described above, since the plurality of light emitting elements 20 are regularly arranged over the entire front surface 31 of the insulating substrate 32 (see FIG. 2A), the plurality of electrode pairs 34A are also regularly arranged over the entire front surface 31 (see FIG. 2B).

Hereinafter, in the present specification, a portion of the circuit pattern layer 34 other than the plurality of electrode pairs 34A is referred to as a wiring portion 34B.

A region of the front surface 31 of the insulating substrate 32 where the circuit pattern layer 34 is disposed (occupied area of the circuit pattern layer 34) is, for example, a region (area) that is equal to or more than 60% of the front surface 31 of the insulating substrate 32 (see FIG. 2A).

[Phosphor Layer]

Regarding the phosphor layer 36 of the present embodiment is, for example, the phosphor layer 36 is disposed on a portion of the front surface 31 of the insulating substrate 32 and the circuit pattern layer 34, other than the plurality of electrode pairs 34A (see FIG. 2A). In the present embodiment, the region of the front surface 31 of the insulating substrate 32 where the phosphor layer 36 is disposed is, for example, a region that is equal to or more than 80% of the front surface 31 of the insulating substrate 32. In other words, the phosphor layer 36 covers a portion of equal to or more than 80% of the front surface 31 of the insulating substrate 32.

A surface (outer surface) of the phosphor layer 36 on the outer side in a thickness direction of the insulating substrate 32 is, for example, positioned on an outer side in the thickness direction, compared to a surface (outer surface) of the circuit pattern layer 34 on the outer side in the thickness direction of the insulating substrate 32.

The phosphor layer 36 is, for example, an insulating layer containing a phosphor (aggregate of a plurality of phosphor particles) and a binder which will be described later, and in which the plurality of phosphor particles are dispersed in the binder. The phosphor contained in the phosphor layer 36 has a property of exciting the light emitted from each light emitting element 20 as excitation light. Specifically, the phosphor of the present embodiment has a property that the light emission peak wavelength when the light emitted by the light emitting element 20 is used as excitation light is in a visible light region. The binder may be, for example, a binder such as an epoxy-based binder, an acrylate-based binder, or a silicone-based binder, and may have an insulating property equivalent to that of the binder contained in a solder resist.

Here, the phosphor contained in the phosphor layer 36 is, for example, at least one or more phosphors selected from the group consisting of an α-type sialon phosphor containing Eu, a β-type sialon phosphor containing Eu, a CASN phosphor containing Eu, and a SCASN phosphor containing Eu. The phosphor described above is an example of the present embodiment, and may be a phosphor other than the phosphor described above, such as YAG, LuAG, BOS, and other visible light-excited phosphors.

The α-type sialon phosphor containing Eu is represented by general formula: $M_xEu_ySi_{12-(m+n)}Al_{(m+n)}O_nN_{16-n}$. In the above general formula, M is one or more elements containing at least Ca selected from the group consisting of Li, Mg, Ca, Y, and lanthanide elements (here, excluding La and Ce), and in a case where a valence of M is a, ax+2y=m, x satisfies 0<x≤1.5, 0.3≤m<4.5, and 0<n≤2.25.

The β-type sialon phosphor containing Eu is a phosphor in which divalent europium ($Eu^{2+}$) is dissolved as a light emitting center in β-type sialon represented by general formula: $Si_{6-z}Al_zO_zN_{8-z}$ (z=0.005 to 1).

In addition, examples of a nitride phosphor include a CASN phosphor containing Eu, a SCASN phosphor containing Eu, and the like.

The CASN phosphor containing Eu (an example of a nitride phosphor) is, for example, a red phosphor which is represented by the formula $CaAlSiN_3:Eu^{2+}$ in which $Eu^{2+}$ is used as an activator and a crystal formed of alkaline earth silicate is used as a base. In the definition of the CASN phosphor containing Eu in the present specification, the SCASN phosphor containing Eu is excluded.

The SCASN phosphor containing Eu (an example of a nitride phosphor) is, for example, a red phosphor which is represented by the formula $(Sr,Ca)AlSiN_3:Eu^{2+}$ in which $Eu^{2+}$ is used as an activator and a crystal formed of alkaline earth silicate is used as a base.

[Rear Surface Pattern Layer]

The rear surface pattern layer (not shown) is a metal layer (copper foil layer as an example) having a pattern disposed on the rear surface 33 side of the insulating substrate 32. In addition, the rear surface pattern layer is, for example, an independent floating layer. The rear surface pattern layer, for example, overlaps with the region that is equal to or more than 80% of the circuit pattern layer 34 disposed on the front surface 31 in the thickness direction of the insulating substrate 32. A region of the rear surface 33 of the insulating substrate 32 where the rear surface pattern layer is disposed (occupied area of the rear surface pattern layer) is, for example, a region (area) that is equal to or more than 80% of the rear surface 33 of the insulating substrate 32.

[Flat Heat Pipe]

Next, the flat heat pipe 40 of the present embodiment will be described with reference to FIGS. 1A and 2A.

The flat heat pipe 40 has a function of removing heat from the light emitting substrate 10, a temperature of which is increased with light emission of the plurality of light emitting elements 20, during the light emitting operation of the light emitting device 100.

The flat heat pipe 40 has a shape of a flat plate bent into an L shape. The flat heat pipe 40 includes a bent portion 42, a first flat plate portion 44, and a second flat plate portion 46, and the first flat plate portion 44 and the second flat plate portion 46 are connected through the bent portion 42. The flat heat pipe 40 is disposed in a state where the first flat plate portion 44 faces the rear surface 33 side of the light emitting substrate 10 (or the insulating substrate 32). In this case, the second flat plate portion 46 is in a state of extending to a side opposite to the side on which the light emitting substrate 10 is disposed in the plate thickness direction of the first flat plate portion 44. Specifically, as shown in FIGS. 1A and 1B, the flat heat pipe 40 is fixed to the plate 66 by bringing a rear surface 44B into contact with a rear surface 66B of the plate 66 configuring a part of the housing 60.

Here, an internal structure of the flat heat pipe 40 will be described.

The flat heat pipe 40 includes a plurality of pipes (not shown) arranged along a width direction thereof. Each pipe is disposed along a longitudinal direction of the flat heat pipe 40. Each pipe forms a closed space, and a working liquid (not shown) is accommodated in the closed space. The working liquid is sealed in the closed space in a depressurized state.

The action of the flat heat pipe 40 with respect to heat will be described later.

[Cooling Fan]

Next, the cooling fan 50 of the present embodiment will be described with reference to FIG. 1A.

The cooling fan 50 has a function of cooling the flat heat pipe 40 during the light emitting operation of the light emitting device 100. The cooling fan 50 is disposed to be adjacent to the housing 60. Specifically, the cooling fan 50 is disposed on one end side of the light emitting substrate 10 in the longitudinal direction.

The cooling fan 50 is configured to apply an air flow generated by the power supplied from the power source (not shown) to the second flat plate portion 46 of the flat heat pipe 40 during the light emitting operation of the light emitting device 100.

[Housing, Power Source, and Switch]

Next, the housing 60, the power source (not shown), and the switch (not shown) of the present embodiment will be described.

As shown in FIGS. 1A and 2A, the housing 60 has a cylindrical bottom as an example and has a function of accommodating the light emitting substrate 10 and the flat heat pipe 40. As shown in FIG. 1A, the housing 60 includes a peripheral wall 62, two bottom walls 64, and a plate 66. Here, the plate 66 is preferably a plate having excellent thermal conductivity, and is, for example, a metal plate (aluminum plate).

Openings (not shown) are formed on a plurality of portions of the housing 60, respectively. That is, the housing 60 is formed with a plurality of openings.

Some openings of the plurality of openings are formed on the two bottom walls 64, respectively. Accordingly, the air flow generated by the cooling fan 50 flows in from one bottom wall 64 of the housing 60 and flows out from the other bottom wall 64. In addition, some openings of the plurality of openings are formed in a portion of the peripheral wall 62 that the surface 31 side of the light emitting substrate 10 faces. As a result, the light emitted by the plurality of light emitting elements 20 of the light emitting substrate 10 is emitted to the outside of the housing 60.

As described above, the power source (not shown) is for supplying power to the light emitting substrate 10 and the cooling fan 50. The switch (not shown) is an interface for turning the power source on and off.

The above is the description of the function and the configuration of the light emitting device 100 of the present embodiment.

<Light Emitting Operation of Light Emitting Device of First Embodiment>

Next, the light emitting operation of the light emitting device 100 of the present embodiment will be mainly described with reference to FIGS. 1A and 3.

First, when the switch (not shown) is turned on, the supply of power is started from the power source (not shown) to the circuit pattern layer 34 through the connector (not shown). Along with this, the plurality of light emitting elements 20 emit light. When the switch (not shown) is turned on, the supply of power is started from the power source to the cooling fan 50. Along with this, the cooling fan 50 rotates the fan around an axis to send the air flow toward the housing 60.

Hereinafter, the light emitting operation performed by the light emitting substrate 10 will be described, and then a cooling operation performed by the flat heat pipe 40 will be described.

[Light Emitting Operation Performed by Light Emitting Substrate]

The plurality of light emitting elements 20 radiate and emit light L (see FIG. 3) radially, and some light L reaches the surface 31 of the phosphor substrate 30. Hereinafter, the behavior of the light L will be described separately according to a traveling direction of the emitted light L.

Some light L emitted from each light emitting element 20 is emitted to the outside of the housing 60 without being incident to the phosphor layer 36. In this case, a wavelength of the light L remains as the same as the wavelength of the light L, in a case of being emitted from each light emitting element 20.

In addition, the light of the flip chip LED itself in some light L emitted from each light emitting element 20 is incident to the phosphor layer 36. Here, the "light of the flip chip LED itself in some light L" described above is light of the emitted light L that is not color-converted by the phosphor of each light emitting element 20 (CSP itself), that is, light of the flip chip LED itself (for example, blue (wavelength is approximately 470 nm) color). Then, in a case where the light L of the flip chip LED itself collides with the phosphor dispersed in the phosphor layer 36, the phosphor excites and emits excitation light. Here, the reason why the phosphor is excited is that the phosphor dispersed in the phosphor layer 36 uses a phosphor (visible light excited phosphor) having an excitation peak in blue light. Along with this, a part of the energy of the light L is used for exciting the phosphor, so that the light L loses a part of the energy. As a result, the wavelength of the light L is converted (wavelength conversion is performed). For example, depending on the type of phosphor in the phosphor layer 36 (for example, in a case where a red CASN is used as the phosphor), the wavelength of light L becomes longer (for example, 650 nm or the like).

In addition, the excitation light in the phosphor layer 36 may be emitted from the phosphor layer 36 as it is, but some of the excitation light goes to the lower circuit pattern layer 34. Then, the excitation light directed to the circuit pattern layer 34 is emitted to the outside by reflection at the circuit pattern layer 34. As described above, in a case where the wavelength of the excitation light by the phosphor is equal to or more than 600 nm, the reflection effect can be expected, even if the circuit pattern layer 34 is formed of Cu. The wavelength of the light L differs from the above example depending on the type of the phosphor in the phosphor layer 36, but in any case, the wavelength conversion of the light L is performed. For example, in a case where the wavelength of the excitation light is less than 600 nm, a reflection effect can be expected, if the circuit pattern layer 34 or its surface is formed of, for example, Ag (plating).

As described above, the light L emitted by each light emitting element 20 (the light L emitted radially by each light emitting element 20) is irradiated to the outside together with the excitation light through a plurality of optical paths as described above. Therefore, in a case where a light emission wavelength of the phosphor contained in the phosphor layer 36 and a light emission wavelength of the phosphor that seals (or covers) the flip chip LED of the light emitting element 20 (CSP) are different from each other, the light emitting substrate 10 of the present embodiment emits a bundle of the light L, in a case of being emitted by each light emitting element 20, by setting it as a bundle of the light L containing the light L at a wavelength different from the wavelength of the light L, in a case of being emitted by each light emitting element 20, together with the excitation light. For example, the light emitting substrate 10 of the present embodiment emits combined light of light (wavelength) emitted by the light emitting element 20 and light (wavelength) emitted from the phosphor layer 36.

Meanwhile, in a case where a light emission wavelength of the phosphor contained in the phosphor layer 36 and a light emission wavelength of the phosphor that seals (or covers) the flip chip LED of the light emitting element 20 (CSP) are the same as each other (in a case of the same correlated color temperature), the light emitting substrate 10 of the present embodiment emits a bundle of the light L, in a case of being emitted by each light emitting element 20, by setting it as a bundle of the light L containing the light L at a wavelength same as the wavelength of the light L, in a case of being emitted by each light emitting element 20, together with the excitation light.

In addition, in a case of the present embodiment (see FIG. 3), unlike a case where the phosphor layer 36 is not provided (see FIG. 4), the light is also emitted from the phosphor layer 36, and accordingly, the glare of the emitted light is reduced.

In a case of the present embodiment, the phosphor layer 36 completely covers the surface 31 of the insulating substrate 32 (see FIGS. 2A and 3). In addition, some light emitted from each light emitting element 20 generates heat when it is incident to the phosphor layer 36 and excited.

The above is the description of the light emitting operation performed by the light emitting substrate 10.

[Cooling Operation Performed by Flat Heat Pipe]

Next, the cooling operation of the light emitting substrate 10 performed by the flat heat pipe 40 will be described with reference to FIG. 1A and the like.

Along with the light emitting operation performed by the light emitting substrate 10, the light emitting substrate 10 generates heat and the temperature thereof is increased. The heat of the light emitting substrate 10, the temperature of which is increased, is propagated from the rear surface 33 thereof to the plate 66, and further propagated from the plate 66 to the first flat plate portion 44 of the flat heat pipe 40. With respect to this, the second flat plate portion 46 maintains a lower temperature state than the first flat plate portion 44, because the air flow from the cooling fan 50 comes into contact therewith and does not come into contact with the plate 66.

Under the conditions described above, when the heat is propagated to the first flat plate portion 44, the working liquid in the first flat plate portion 44 boils (hereinafter, referred to as a first stage).

Next, the working liquid in the first flat plate portion 44 boils and becomes vapor, and flows as a vapor flow toward the inside of the second flat plate portion 46, which is on a lower temperature side in the closed space (hereinafter referred to as a second stage). That is, the first flat plate portion 44 functions as a heat input portion into which the heat from the light emitting substrate 10 is input.

Next, in the vapor that has reached the inside of the second flat plate portion 46, the heat of its own is reduced by the second flat plate portion 46, which is lower in temperature than the first flat plate portion 44. As a result, the vapor, from which the heat is reduced, in the second flat plate portion 46 condenses (hereinafter referred to as a third stage). That is, the second flat plate portion 46 functions as a heat output portion that outputs the heat from the light emitting substrate 10.

Next, the working liquid condensed in the second flat plate portion 46 returns to the side of the first flat plate portion 44 due to a capillary phenomenon, a self-excited vibration phenomenon, or the like (hereinafter referred to as a fourth stage).

By doing so, during a period of the light emitting operation performed by the light emitting substrate 10, the flat heat pipe 40 is cooled by the cooling fan 50 while being heated by the light emitting substrate 10, and accordingly, the temperature of the light emitting substrate 10 is prevented from being a certain temperature or higher. In other words, the flat heat pipe 40 maintains the temperature of the light emitting substrate 10 that performs the light emitting operation to be equal to or lower than the certain temperature by the cooling fan 50.

The above is the description of the cooling operation performed by the flat heat pipe 40. In addition, the above is the description of the light emitting operation of the light emitting substrate 10 of the present embodiment.

Effect of First Embodiment

Next, the effect of this embodiment will be described.

[First Effect]

The light emitting device 100 of the present embodiment includes a light emitting substrate 10, a flat heat pipe 40, and a cooling fan 50 (see FIG. 1A).

Here, the light emitting substrate 10 includes the phosphor layer 36 that is disposed on the surface 31 of the insulating substrate 32 and excites and emits light incident from the plurality of light emitting elements 20 (see FIGS. 2A and 3).

However, the light emitting device 100 of the present embodiment includes the flat heat pipe 40 and the cooling fan 50 (see FIG. 1A). Accordingly, during a period of the light emitting operation performed by the light emitting substrate 10, the flat heat pipe 40 is cooled by the cooling fan 50 while being heated by the light emitting substrate 10, and accordingly, the temperature of the light emitting substrate 10 can be prevented from being a certain temperature or higher. Here, the certain temperature means an upper limit temperature of a temperature at which the light emitting element 20 does not fail.

From the above, the light emitting device 100 of the present embodiment can appropriately remove the heat of the light emitting substrate 10, a temperature of which is increased with the light emission of the plurality of light emitting elements 20 and the phosphor layer 36.

In the light emitting substrate 10 of the present embodiment, as described above, the phosphor layer 36 covers a portion of equal to or more than 80% of the front surface 31 of the insulating substrate 32 (see FIG. 2A). In other words, most of the surface 31 of the light emitting substrate 10 of the present embodiment is covered with the phosphor layer 36. Therefore, it can be said that this effect is more effective as the area occupied by the phosphor layer 36 is larger. In addition, in the light emitting device 100 of the present embodiment, the light emitting substrate 10 is accommodated in the housing 60 (see FIGS. 1A and 1B). That is, it can be said that, in the light emitting device 100 of the present embodiment, the heat generated with the light emitting operation of the light emitting substrate 10 is likely to be accumulated in the housing 60. However, the air flow (cooling air) from the cooling fan 50 efficiently flows through the housing 60.

[Second Effect]

The flat heat pipe 40 of the present embodiment is L-shaped and includes the first flat plate portion 44 which functions as the heat input portion and the second flat plate portion 46 which functions as the heat output portion (see FIG. 1A). The flat heat pipe 40 is disposed so that the first flat plate portion 44 faces the rear surface 33 side of the light emitting substrate 10 and the second flat plate portion 46 is exposed to the air flow from the cooling fan 50.

Therefore, the light emitting device 100 of the present embodiment can appropriately remove the heat of the light emitting substrate 10, the temperature of which is increased by the light emission of the plurality of light emitting elements 20 and the phosphor layer 36, by devising the shape of the flat heat pipe 40.

The above is the description of the effect of the present embodiment. In addition, the above is the description of the first embodiment.

Second Embodiment

Figure 5A:
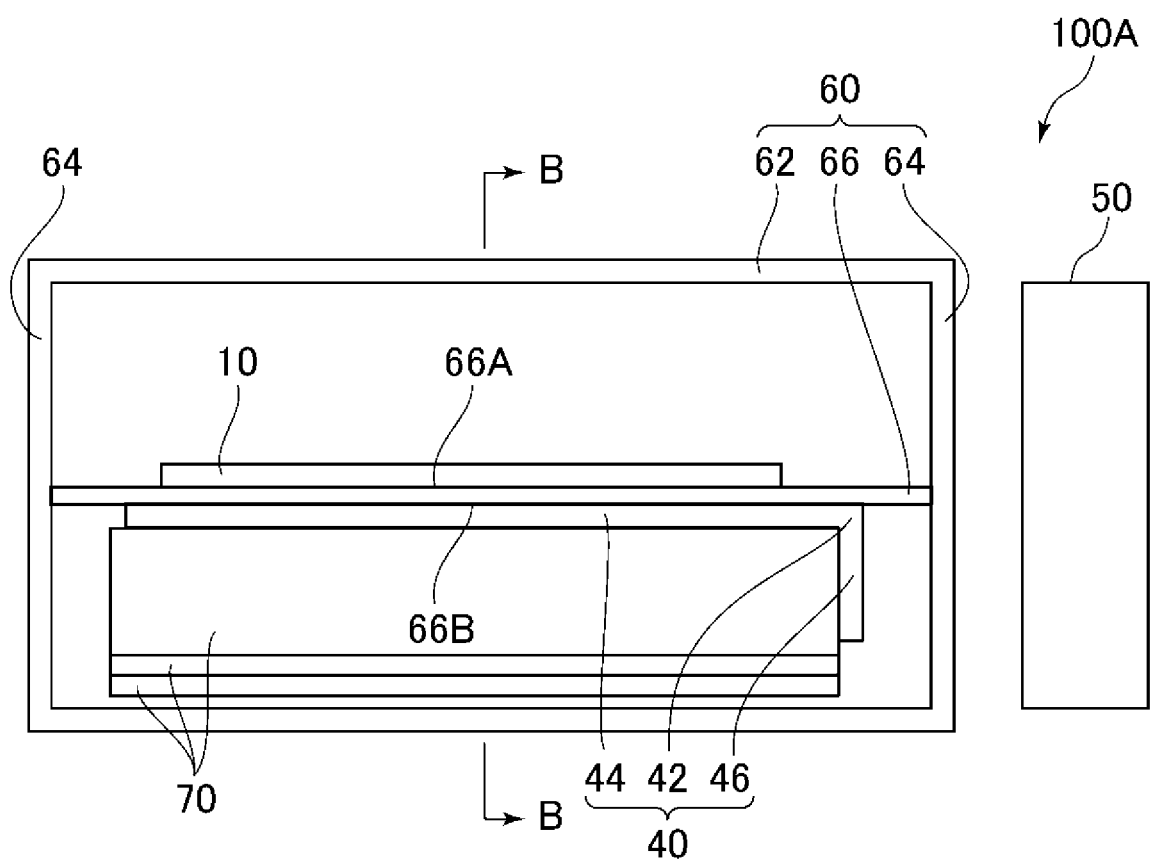
FIG. 5A is a schematic view of a light emitting device of a second embodiment.
Figure 5B:
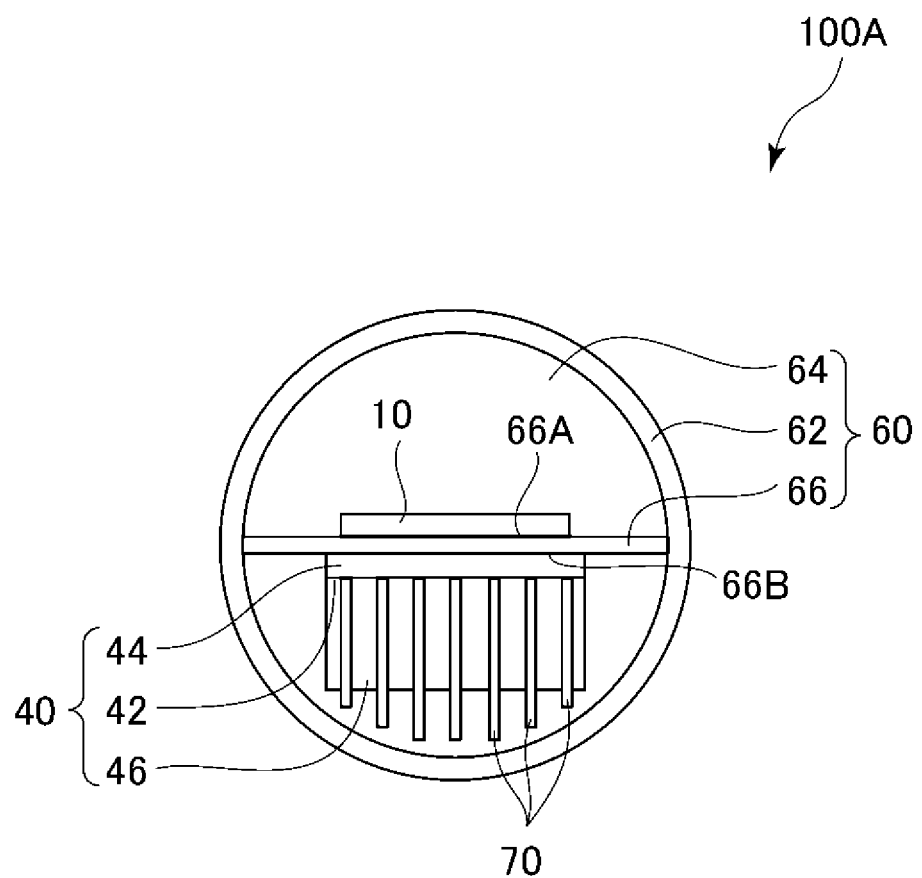
FIG. 5B is a cross-sectional view taken along a cutting line B-B of FIG. 5A.

Next, a second embodiment will be described with reference to FIGS. 5A and 5B. Hereinafter, only the parts of the present embodiment that are different from those of the first embodiment (see FIGS. 1A, 1B, and the like) will be described.

<Function, Configuration, and Light Emitting Operation of Light Emitting Device of Second Embodiment>

A light emitting device 100A of the present embodiment has the basic configuration of the light emitting device 100 of the first embodiment and further includes a heat sink 70.

Here, the heat sink 70 has a function of dissipating some heat removed from the light emitting substrate 10 by the flat heat pipe 40. The heat sink 70 is disposed on a side opposite to the light emitting substrate 10 with the flat heat pipe 40 interposed therebetween, and comes into contact with the first flat plate portion 44 of the flat heat pipe 40. As an example, the heat sink 70 is configured of a plurality of plates, and is arranged in a width direction of the first flat plate portion 44 while protruding in the plate thickness direction of the first flat plate portion 44 in the same manner as the second flat plate portion 46.

The function and configuration of the light emitting device 100A of the present embodiment are different from those of the first embodiment in terms of the above points.

In addition, the light emitting operation of the light emitting device 100A of the present embodiment is the same as that of the first embodiment, except that the heat sink 70 dissipates some heat from the first flat plate portion 44.

The above is a description of the function, the configuration, and the light emitting operation of the light emitting device 100A of the second embodiment.

Effect of Second Embodiment

As described above, the light emitting device 100A of the present embodiment has the basic configuration of the light emitting device 100 of the first embodiment, and includes the heat sink 70 that dissipates some heat from the first flat plate portion 44.

Therefore, the light emitting device 100A of the present embodiment can maintain the temperature of the light emitting device 100A at a lower temperature during the light emitting operation of the light emitting device 100A, compared to the light emitting device 100 of the first embodiment.

Other effects of this embodiment are the same as those of the first embodiment.

The above is the description of the second embodiment.

Third Embodiment

Next, a third embodiment will be described with reference to FIGS. 6A and 6B. Hereinafter, only the parts of the present embodiment that are different from those of the second embodiment (see FIGS. 5A, 5B, and the like) will be described.

<Function, Configuration, and Light Emitting Operation of Light Emitting Device of Third Embodiment>

A light emitting device 100B of the present embodiment has the basic configuration of the light emitting device 100 of the first embodiment and further includes a heat sink 70, in the same manner as the light emitting device 100A of the second embodiment.

However, in a case of the present embodiment, a posture of the flat heat pipe 40 attached to the plate 66 is different from that of the second embodiment. Specifically, the flat heat pipe 40 of the present embodiment is attached to the plate 66 so that the second flat plate portion 46 is positioned on a side opposite to the cooling fan 50 side. Accordingly, in the present embodiment, the heat sink 70 is disposed between the second flat plate portion 46 and the cooling fan 50.

The function, the configuration, and the light emitting operation of the light emitting device 100B of the present embodiment are different from those of the second embodiment in terms of the above points.

Effect of Third Embodiment

As described above, in the light emitting device 100B of the present embodiment, unlike the light emitting device 100A of the second embodiment, the second flat plate portion 46 of the flat heat pipe 40 is positioned on the side opposite to the cooling fan 50 side. In other words, in the light emitting device 100B of the present embodiment, the heat sink 70 is disposed between the second flat plate portion 46 and the cooling fan 50. Accordingly, in a case of the present embodiment, unlike the case of the second embodiment, the air flow generated by the cooling fan 50 also hits the heat sink 70.

Therefore, the light emitting device 100B of the present embodiment can maintain the temperature of the light emitting device 100B at a lower temperature during the light emitting operation of the light emitting device 100B, compared to the light emitting device 100A of the second embodiment.

Other effects of this embodiment are the same as those of the first and second embodiments.

The above is the description of the third embodiment.

Fourth Embodiment

Figure 7A:
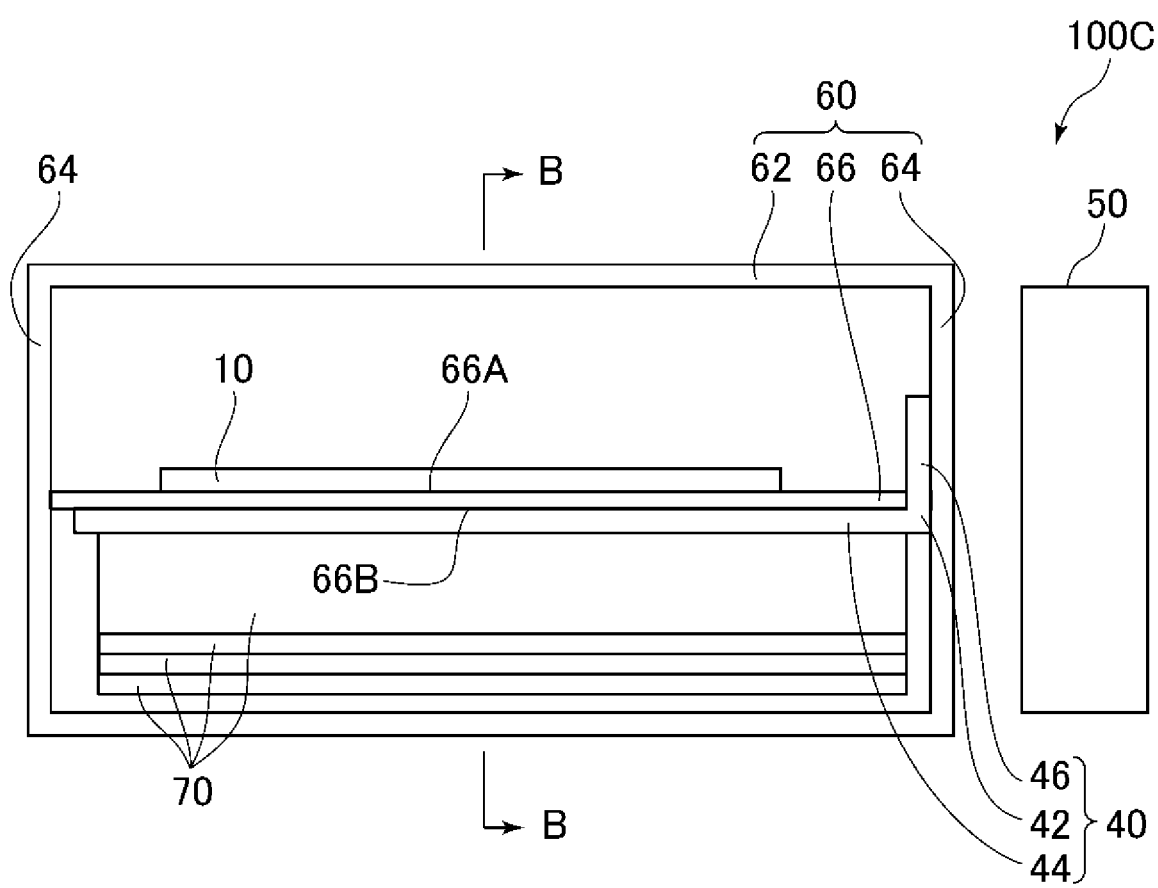
FIG. 7A is a schematic view of a light emitting device of a fourth embodiment.
Figure 7B:
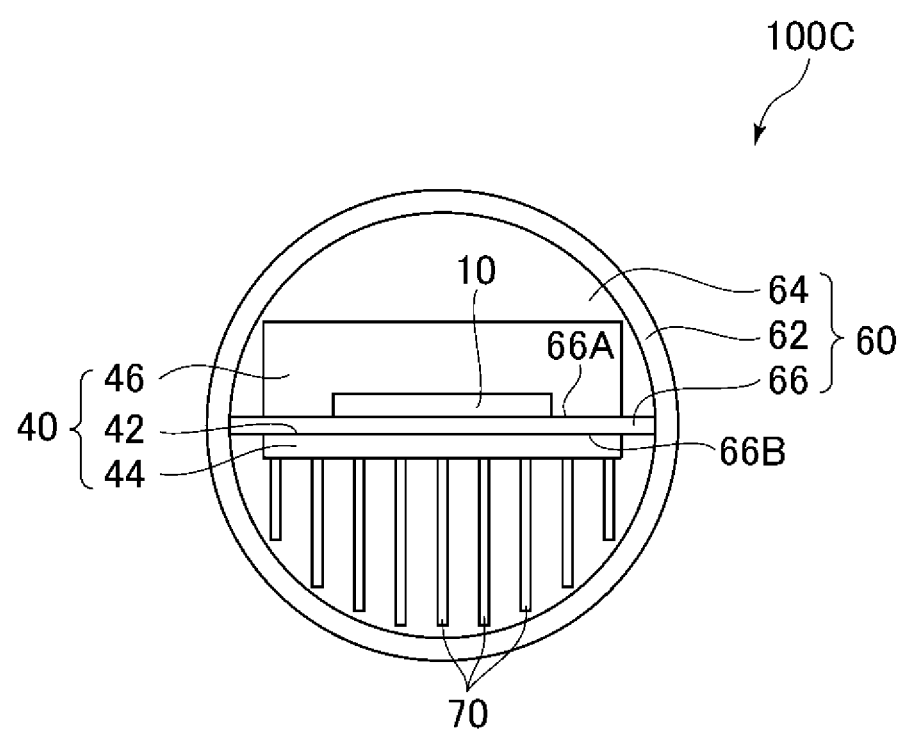
FIG. 7B is a cross-sectional view taken along a cutting line B-B of FIG. 7A.

Next, a fourth embodiment will be described with reference to FIGS. 7A and 7B. Hereinafter, only the parts of the present embodiment that are different from those of the second embodiment (see FIGS. 5A, 5B, and the like) will be described.

<Function, Configuration, and Light Emitting Operation of Light Emitting Device of Fourth Embodiment>

A light emitting device 100C of the present embodiment has the basic configuration of the light emitting device 100 of the first embodiment and further includes a heat sink 70, in the same manner as the light emitting device 100A of the second embodiment.

However, in a case of the present embodiment, a posture of the flat heat pipe 40 attached to the plate 66 is different from that of the second embodiment. Specifically, the flat heat pipe 40 of the present embodiment is attached to the plate 66 so that the second flat plate portion 46 protrudes toward the light emitting substrate 10 side in the plate thickness direction of the first flat plate portion 44.

The function, the configuration, and the light emitting operation of the light emitting device 100C of the present embodiment are different from those of the second embodiment in terms of the above points.

Effect of Fourth Embodiment

As described above, in the light emitting device 100C of the present embodiment, unlike the light emitting device 100A of the second embodiment, the second flat plate portion 46 of the flat heat pipe 40 does not overlap the heat sink 70, when seen in the longitudinal direction of the first flat plate portion 44. Accordingly, in a case of the present embodiment, unlike the case of the second embodiment, the air flow generated by the cooling fan 50 also hits the heat sink 70.

Therefore, the light emitting device 100C of the present embodiment can maintain the temperature of the light emitting device 100C at a lower temperature during the light emitting operation of the light emitting device 100C, compared to the light emitting device 100A of the second embodiment.

Other effects of this embodiment are the same as those of the first and second embodiments.

Figure 6A:
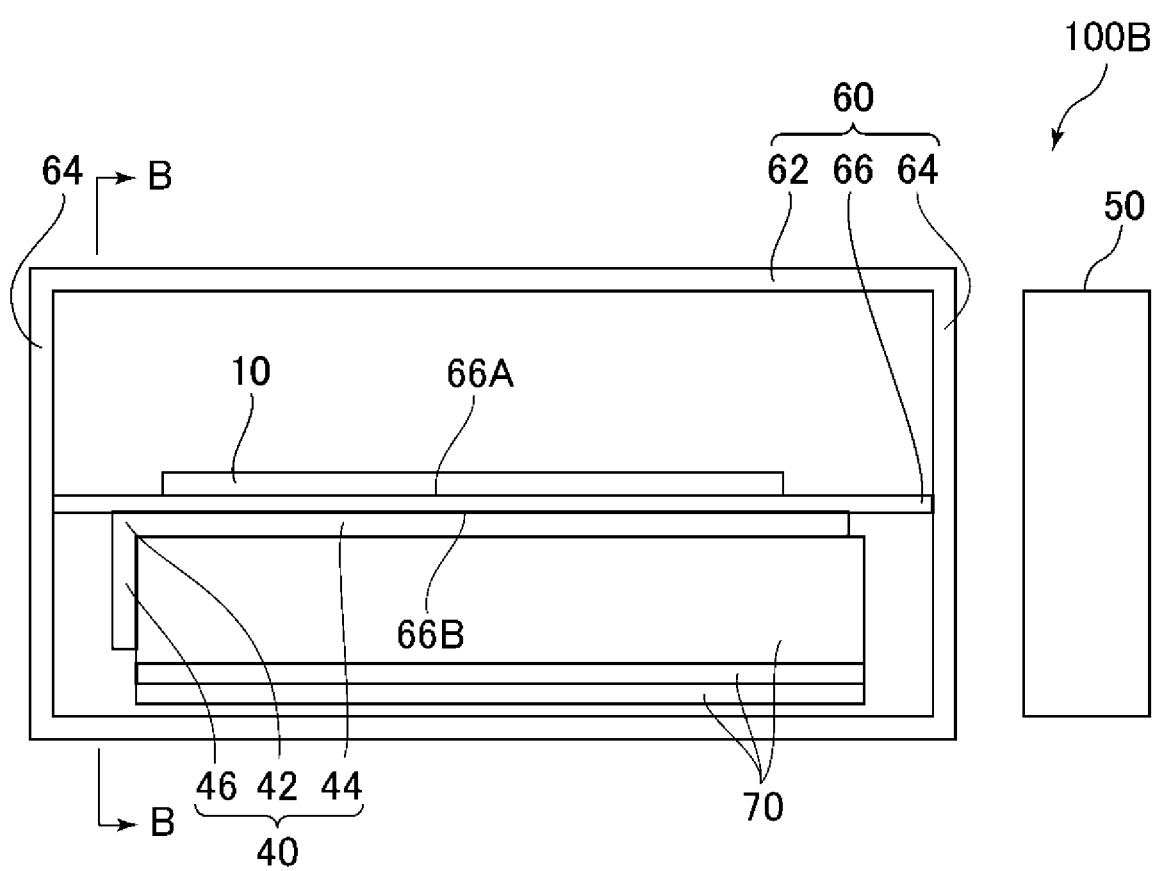
FIG. 6A is a schematic view of a light emitting device of a third embodiment.
Figure 6B:
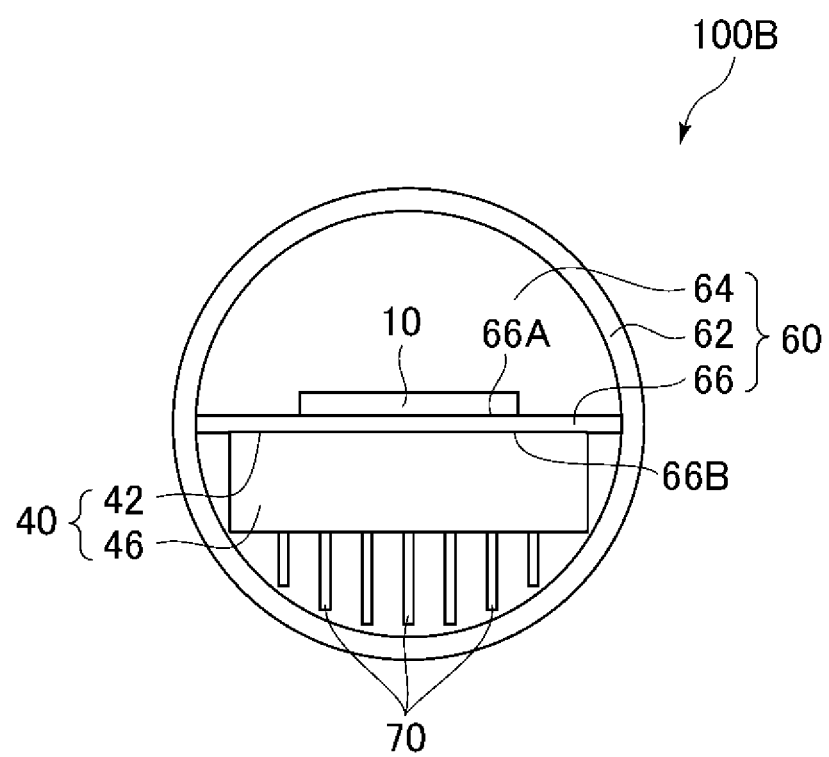
FIG. 6B is a cross-sectional view taken along a cutting line B-B of FIG. 6A.

In a case of the present embodiment, the air flow hitting the second flat plate portion 46 does not pass through an arrangement region of the heat sink 70, unlike the case of the third embodiment (see FIGS. 6A and 6B). Therefore, the light emitting device 100C of the present embodiment can maintain the temperature of the light emitting device 100C at a lower temperature during the light emitting operation of the light emitting device 100C, compared the case of the third embodiment.

The above is the description of the fourth embodiment.

Fifth Embodiment

Figure 8A:
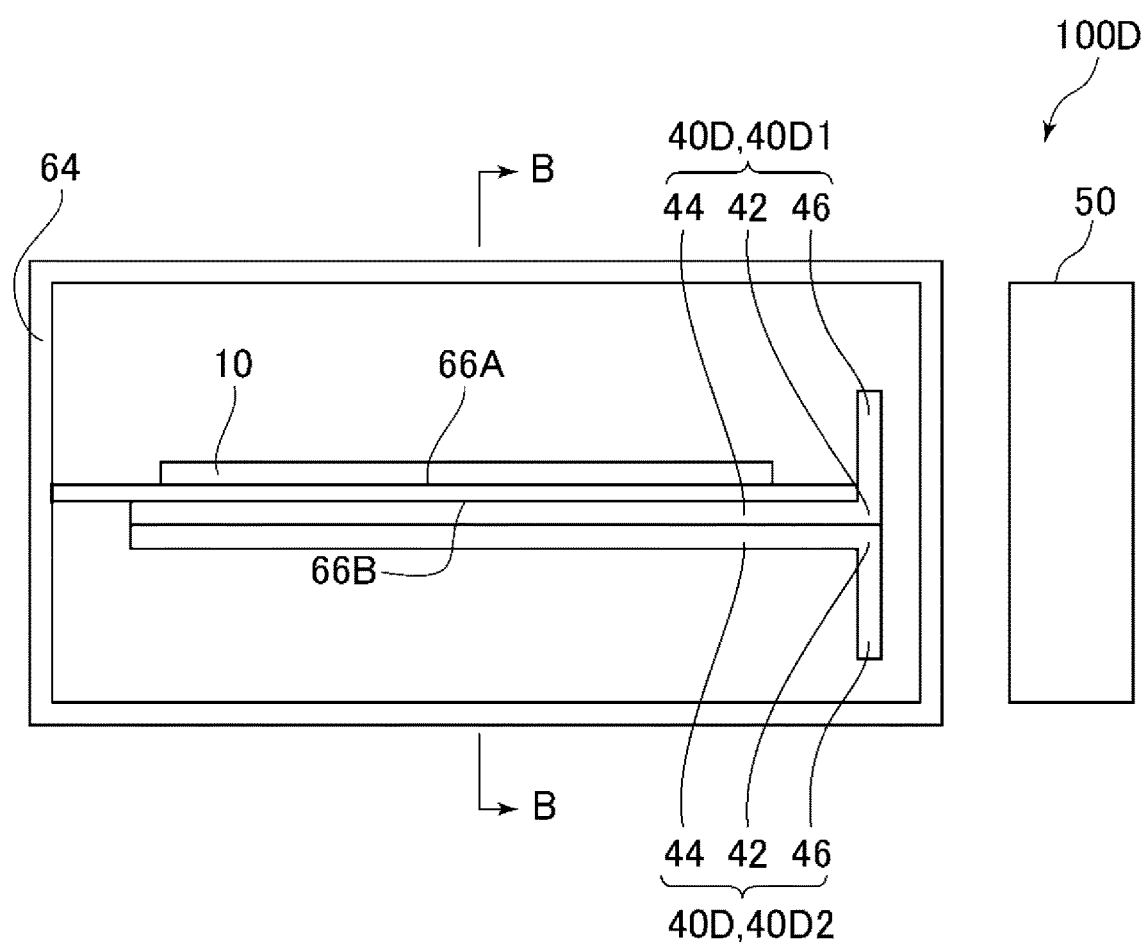
FIG. 8A is a schematic view of a light emitting device of a fifth embodiment.
Figure 8B:
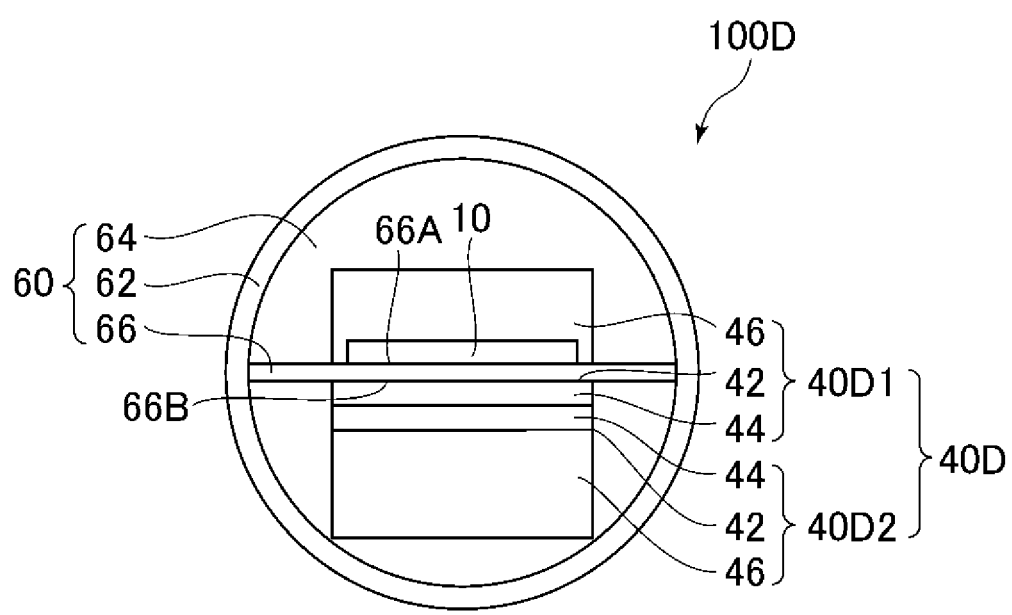
FIG. 8B is a cross-sectional view taken along a cutting line B-B of FIG. 8A.

Next, a fifth embodiment will be described with reference to FIGS. 8A and 8B. Hereinafter, only the parts of the present embodiment that are different from those of the first embodiment (see FIGS. 1A, 1B, and the like) will be described.

<Function, Configuration, and Light Emitting Operation of Light Emitting Device of Fifth Embodiment>

In a light emitting device 100D of the present embodiment, the flat heat pipe 40 of the light emitting device 100 of the first embodiment is changed to two flat heat pipes 40D (another example of the flat heat pipe mechanism). The flat heat pipe 40D includes a first flat heat pipe 40D1 and a second flat heat pipe 40D2, each having the same configuration as the flat heat pipe 40 of the first embodiment.

The first flat heat pipe 40D1 is disposed in a state where the first flat plate portion 44 faces the light emitting substrate 10 side (rear surface 33 side of the insulating substrate 32). In addition, the second flat heat pipe 40D2 is disposed so that the first flat plate portion 44 overlaps the first flat plate portion 44 of the first flat heat pipe 40D1. The second flat plate portion 46 of the first flat heat pipe 40D1 and the second flat plate portion 46 of the second flat heat pipe 40D2 are disposed in a state where the second flat plate portions extend to opposite sides of each other.

The function and configuration of the light emitting device 100D of the present embodiment are different from those of the first embodiment in terms of the above points.

In addition, the light emitting operation of the light emitting device 100D of the present embodiment is the same as in the case of the first embodiment, except that the temperature of the light emitting substrate 10 which performs the light emitting operation is maintained to be equal to or lower than the certain temperature by the two flat heat pipes 40D (first flat heat pipe 40D1 and the second flat heat pipe 40D2) and the cooling fan 50.

The above is a description of the function, the configuration, and the light emitting operation of the light emitting device 100D of the fifth embodiment.

Effect of Fifth Embodiment

As described above, unlike the light emitting device 100 of the first embodiment, the light emitting device 100D of the present embodiment is configured of the two flat heat pipes 40D (first flat heat pipe 40D1 and second flat heat pipe 40D2).

Therefore, the light emitting device 100D of the present embodiment can maintain the temperature of the light emitting device 100A at a lower temperature during the light emitting operation of the light emitting device 100A, compared to the light emitting device 100 of the first embodiment.

Other effects of this embodiment are the same as those of the first embodiment.

The above is the description of the fifth embodiment. In addition, a modification example (not shown) in which the present embodiment is used as the basic configuration and the heat sink 70 (see FIGS. 5A and 5B) of the second embodiment is included may be used.

Sixth Embodiment

Figure 9A:
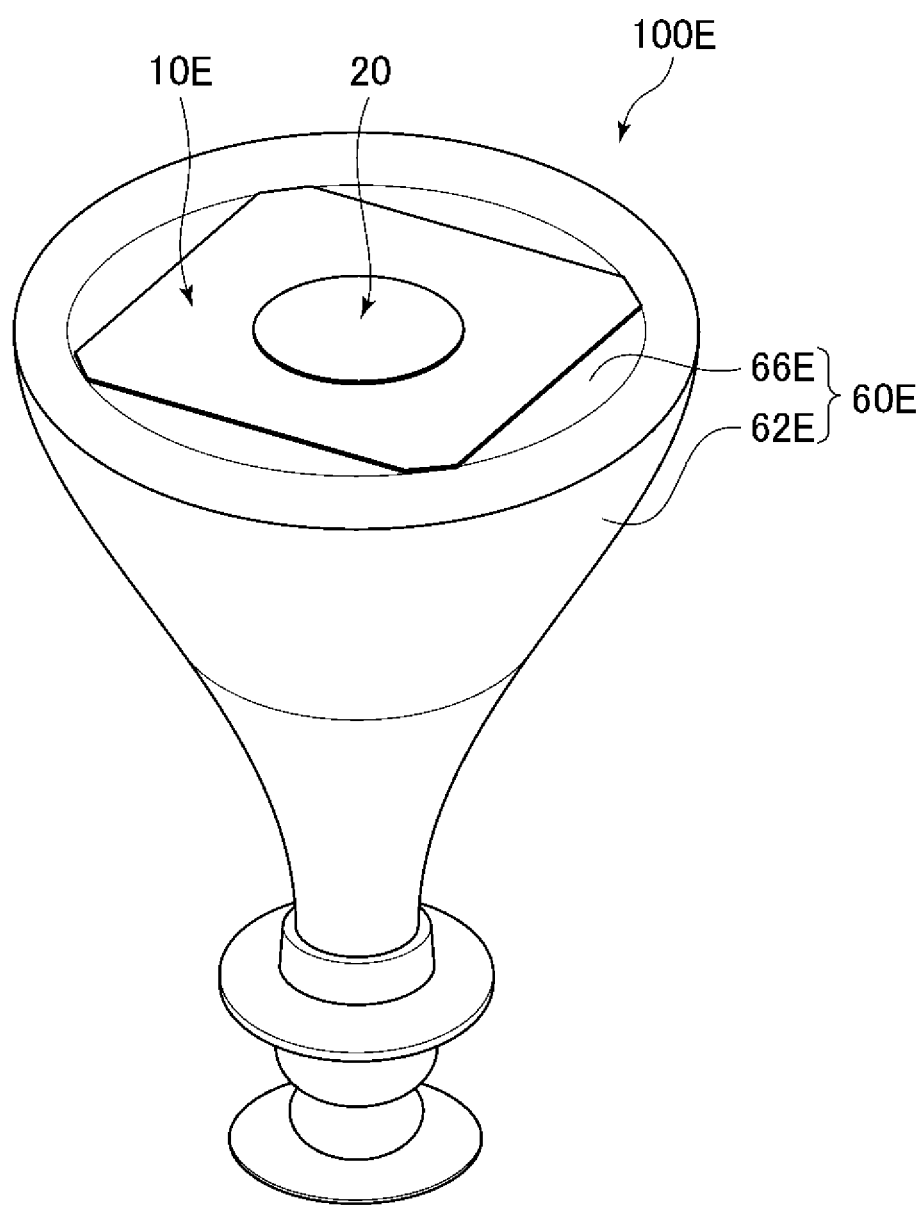
FIG. 9A is a perspective view of a light emitting device of a sixth embodiment.
Figure 9B:
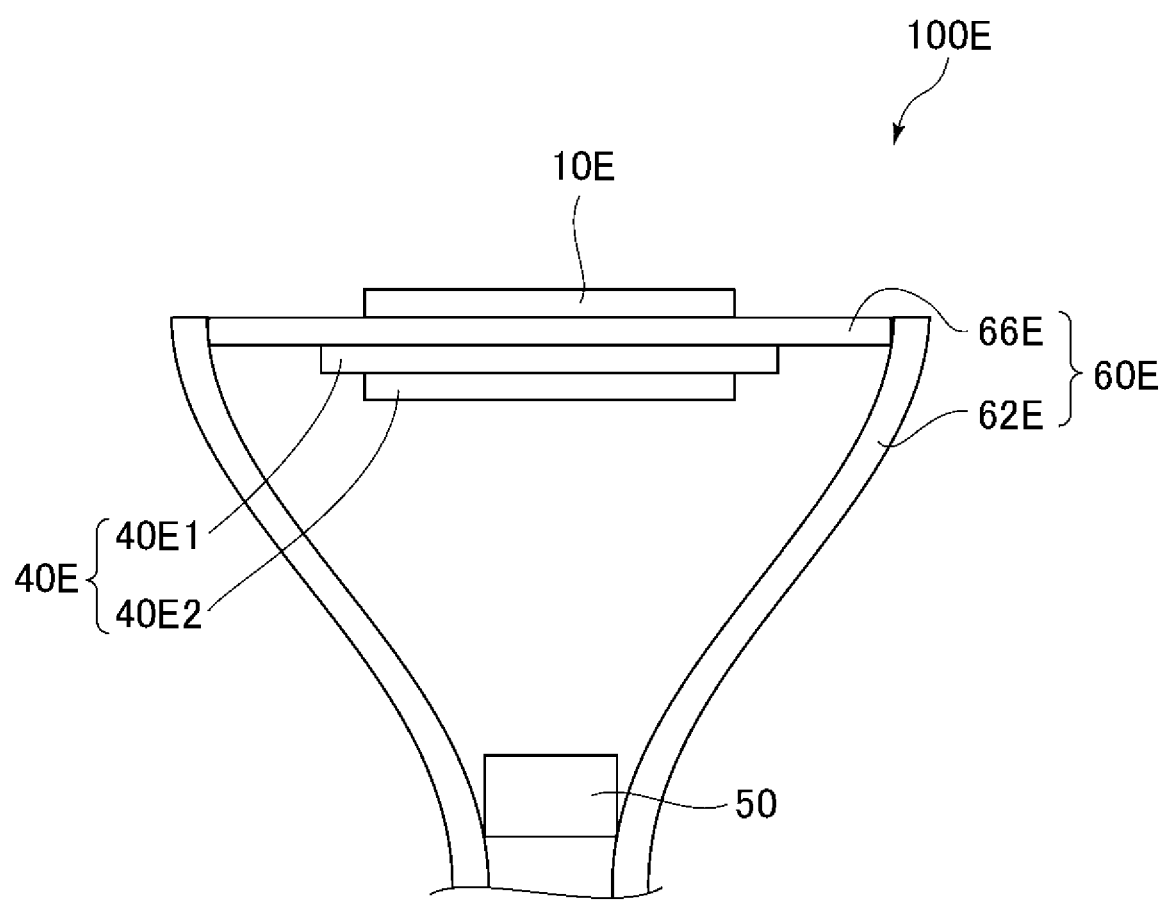
FIG. 9B is a schematic view of a light emitting device of a sixth embodiment.
Figure 9C:
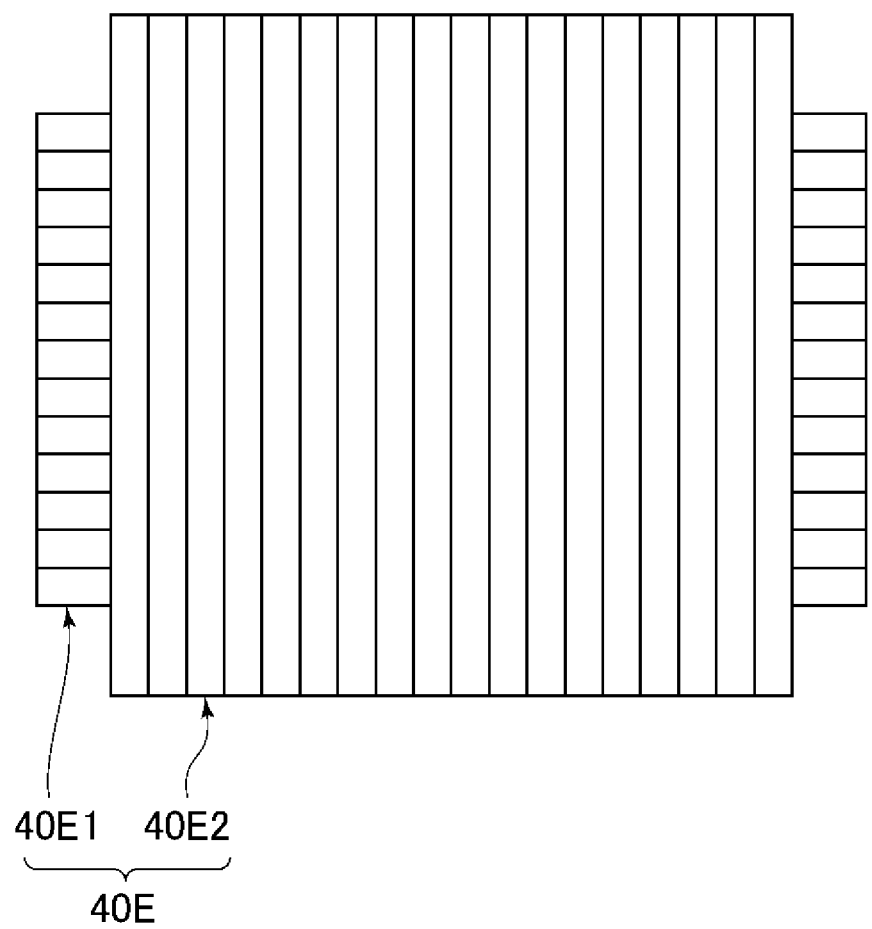
FIG. 9C is a view of a flat heat pipe mechanism included in the light emitting device of the sixth embodiment when seen from a cooling fan side.

Hereinafter, a sixth embodiment will be described with reference to FIGS. 9A to 9C. Hereinafter, only the parts of the present embodiment that are different from those of the first embodiment (see FIGS. 1A, 1B, and the like) will be described.

<Function, Configuration, and Light Emitting Operation of Light Emitting Device of Sixth Embodiment>

Unlike the light emitting device 100 of the first embodiment, a light emitting device 100E of the present embodiment is configured to have a conical shape as a whole.

The light emitting device 100E includes a light emitting substrate 10E, two flat heat pipes 40E (an example of a flat heat pipe mechanism), the cooling fan 50 (an example of a cooling unit), a housing 60E (an example of an accommodation unit), the power source (not shown), and the switch (not shown).

The housing 60E includes a conical peripheral wall 62E and, for example, an upper wall 66E formed of a material having excellent thermal conductivity.

The light emitting substrate 10E has a square shape as an example, but other configurations are the same as those of the light emitting substrate 10 of the first embodiment. In addition, the light emitting substrate 10E is disposed on an outer surface of the upper wall 66E.

The two flat heat pipes 40E are configured of a first flat heat pipe 40E1 and a second flat heat pipe 40E2, and each has a flat plate shape. Here, internal structures of the first flat heat pipe 40E1 and the second flat heat pipe 40E2 will be described. The first flat heat pipe 40E1 and the second flat heat pipe 40E2 have the same structure. The two flat heat pipes 40E are disposed on the inner surface of the upper wall 66E and on a portion on a side opposite to the light emitting substrate 10E with the upper wall 66E interposed therebetween.

The first flat heat pipe 40E1 includes a plurality of pipes 40E11 arranged in a predetermined direction. Each pipe 40E11 forms a closed space, and a working liquid (not shown) is accommodated in the closed space. The working liquid is sealed in the closed space in a depressurized state. The second flat heat pipe 40E2 is disposed on a side opposite to the upper wall 66E with the first flat heat pipe 40E1 interposed therebetween. In addition, an arrangement direction of the plurality of pipes 40E21 of the second flat heat pipe 40E2 is different from that of the first flat heat pipe 40E1 (in the case of the present embodiment, an orthogonal direction, for example).

Unlike the case of the first embodiment, the cooling fan 50 is disposed inside the housing 60E and on a side opposite to the light emitting substrate 10E with the two flat heat pipes 40E interposed therebetween.

The function, the configuration, and the light emitting operation of the light emitting device 100E of the present embodiment are different from those of the first embodiment in terms of the above points.

Effect of Sixth Embodiment

As described above, in the light emitting device 100E of the present embodiment, the arrangement direction of the plurality of pipes 40E11 of the first flat heat pipe 40E1 and the arrangement direction of the plurality of pipes 40E21 of the second flat heat pipe 40E2 are directions intersecting with each other. Accordingly, in the first flat heat pipe 40E1 and the second flat heat pipe 40E2, circulation directions of the working liquid inside thereof are the directions intersecting with each other.

Therefore, the light emitting device 100E of the present embodiment can reduce a temperature gradient of the light emitting substrate 10E, compared to a case where one of the first flat heat pipe 40E1 and the second flat heat pipe 40E2 is not provided.

Other effects of this embodiment are the same as those of the first embodiment.

The above is the description of the fifth embodiment.

As described above, the present invention has been described with reference to each embodiment described above, but the present invention is not limited to each embodiment described above. At least, any embodiment having a configuration that exhibits the first effect described above is included in the technical scope of the present invention.

For example, in the description of each embodiment, it is assumed that the light emitting substrate 10 includes the plurality of light emitting elements 20. However, the number of light emitting elements 20 included in the light emitting substrate 10 may be one. That is, the light emitting substrate of this modification example may have at least one light emitting element 20.

In addition, in the description of each embodiment, the light emitting substrate 10 was configured to include the phosphor layer 36 that is disposed on the surface 31 of the insulating substrate 32 and excites and emits light incident from the plurality of light emitting elements 20 (see FIGS. 2A and 3). That is, it is described that the light emitting substrate 10 included in the light emitting devices 100, 100A, and the like of each embodiment includes the phosphor layer 36 as a constituent element.

However, for example, a light emitting device including a light emitting substrate (not shown) different from the case of each embodiment in that the insulating substrate 32 and the plurality of light emitting elements 20 are included and the phosphor layer 36 is not included may be used. Even in the case of this modification example, since the flat heat pipe 40 and the like remove the heat from the light emitting substrate, the temperature of which is increased with the light emission of each light emitting element 20, the effect described in the description of the effect of each embodiment is exhibited.

The light emitting substrate of this modification example has the plurality of light emitting elements 20, but for example, the number of light emitting elements 20 may be one. That is, the light emitting substrate of this modification example may have at least one light emitting element 20.

In addition, in each embodiment, the light emitting substrates 10 and 10E and the flat heat pipes 40 and 40E were configured to be fixed to the plate 66, respectively. However, the light emitting substrates 10 and 10E and the flat heat pipes 40 and 40E may be directly fixed to each other.

In addition, in the cases of the first to sixth embodiments, the cooling fan 50 was configured to be disposed to be adjacent to the housing 60 (see FIGS. 1A, 5A, 6A, 7A and 8A). However, the cooling fan 50 may be located inside the housing 60. In this case, the cooling fan 50 may be disposed to be adjacent to one bottom wall 64 of the housing 60 inside the housing 60, and the cooling fan 50 may take the external air from the one bottom wall 64 (the opening is formed as described above) and blow out the internal air of the housing 60 from the opening of the other bottom wall 64. In the case of this modification example, it is effective in that cooling can be performed more efficiently than in the case of each embodiment described above.

This application claims priority based on Japanese Patent Application No. 2019-108125 filed on Jun. 10, 2019, the entire disclosure of which is incorporated herein.

REFERENCE SIGNS LIST

10: Light emitting substrate
10E: light emitting substrate
20: light emitting element
30: phosphor substrate
31: front surface
32: insulating substrate
33: rear surface
34: circuit pattern layer
34A: electrode pair
34B: wiring portion
36: phosphor layer
37: terminal
39: through hole
40: flat heat pipe (an example of flat heat pipe mechanism)
40A: first flat heat pipe
40B: second flat heat pipe
40D: flat heat pipe (an example of flat heat pipe mechanism)
40E: flat heat pipe (an example of flat heat pipe mechanism)
40E1: first flat heat pipe
40E2: second flat heat pipe
40E11: pipe
40E21: pipe
42: Bent portion
44: first flat plate portion
46: second flat plate portion
50: cooling fan (an example of cooling unit)
60: housing
60E: housing
62: peripheral wall
62E: peripheral wall
64: bottom wall
66: plate
66A: front surface
66B: rear surface
66E: upper wall
70: heat sink
100: light emitting device
100A: light emitting device
100B: light emitting device
100C: light emitting device
100D: light emitting device
100E: light emitting device
L: light

The invention claimed is:

1. A light emitting device comprising:
a light emitting substrate including an insulating substrate, a circuit pattern layer disposed on one surface of the insulating substrate, a plurality of light emitting elements bonded to the circuit pattern layer, and a phosphor layer that is disposed on the one surface of the insulating substrate without contacting a top surface of each of the plurality of light emitting elements and includes a phosphor in which a light emission peak wavelength, in a case where light emitted by at least one light emitting element of the plurality of light emitting elements is used as excitation light, is in a visible light region;
a flat heat pipe mechanism that removes heat from the light emitting substrate, a temperature of which is increased with light emission of the at least one light emitting element; and
a cooling unit that cools the flat heat pipe mechanism, wherein
the light emitting substrate emits a composite light of light emitting color of the at least one light emitting element and light emitting color of the phosphor layer, and
the flat heat pipe mechanism removes heat generated by the phosphor layer, a temperature of which is increased with light emission of the phosphor layer.

2. The light emitting device according to claim 1, further comprising:
a heat sink that dissipates heat of the flat heat pipe mechanism.

3. The light emitting device according to claim 2,
wherein the cooling unit cools the heat sink by applying an air flow to the heat sink.

4. The light emitting device according to claim 2,
wherein the heat sink is disposed on a side opposite to the light emitting substrate with the flat heat pipe mechanism interposed between the heat sink and the light emitting substrate, and dissipates heat removed from the light emitting substrate by the flat heat pipe mechanism.

5. The light emitting device according to claim 1,
wherein the phosphor layer covers a portion that is equal to or more than 80% of the one surface of the insulating substrate.

6. The light emitting device according to claim 1, further comprising:
a heat sink that dissipates heat of the flat heat pipe mechanism,
wherein the heat sink is disposed on a side opposite to the light emitting substrate with the flat heat pipe mechanism interposed between the heat sink and the light emitting substrate, and dissipates heat removed from the light emitting substrate by the flat heat pipe mechanism,
the flat heat pipe mechanism is an L-shaped flat heat pipe having a first flat plate portion which is a heat input portion and a second flat plate portion which is a heat output portion,
the flat heat pipe is disposed in a state where the first flat plate portion faces the other surface side of the insulating substrate, the cooling unit cools the flat heat pipe by applying an air flow to the second flat plate portion, and the heat sink is disposed between the second flat plate portion and the cooling unit.

7. A light emitting device comprising:
a light emitting substrate including an insulating substrate, a circuit pattern layer disposed on one surface of the insulating substrate, a plurality of light emitting elements bonded to the circuit pattern layer, and a phosphor layer that is disposed on the one surface of the insulating substrate without contacting a top surface of each of the plurality of light emitting elements and includes a phosphor in which a light emission peak wavelength, in a case where light emitted by at least one light emitting element of the plurality of light emitting elements is used as excitation light, is in a visible light region, the light emitting substrate emitting a composite light of light emitting color of the at least one light emitting element and light emitting color of the phosphor layer;
a flat heat pipe that removes heat generated by the phosphor layer, a temperature of which is increased with light emission of the phosphor layer, and heat from the light emitting substrate, a temperature of which is increased with light emission of the at least one light emitting element; and
a cooling fan that cools the flat heat pipe.

\* \* \* \* \*